(12) United States Patent
Chanu et al.

(10) Patent No.: US 11,333,838 B2
(45) Date of Patent: *May 17, 2022

(54) COOLING APPARATUS FOR PLUGGABLE MODULES

(71) Applicant: Accedian Networks Inc., St-Laurent (CA)

(72) Inventors: Marcel Chanu, Lachine (CA); Guillaume Turgeon, St-Laurent (CA)

(73) Assignee: Accedian Networks Inc., Saint-Laurent (CA)

( * ) Notice: Subject to any disclaimer, the term of this patent is extended or adjusted under 35 U.S.C. 154(b) by 0 days.

This patent is subject to a terminal disclaimer.

(21) Appl. No.: 17/003,025

(22) Filed: Aug. 26, 2020

(65) Prior Publication Data

US 2020/0386959 A1    Dec. 10, 2020

Related U.S. Application Data

(63) Continuation of application No. 14/967,712, filed on Dec. 14, 2015, now Pat. No. 10,884,203.

(60) Provisional application No. 62/255,761, filed on Nov. 16, 2015.

(51) Int. Cl.
*G02B 6/42* (2006.01)
*H05K 7/20* (2006.01)

(52) U.S. Cl.
CPC ....... *G02B 6/4268* (2013.01); *H05K 7/20336* (2013.01)

(58) Field of Classification Search
CPC ........... H05K 7/20418; H05K 7/20445; H05K 7/2049; H05K 7/20509; H05K 13/0023; H05K 7/20336; H05K 7/20254; H05K 7/20; H01L 23/40–4093; H01L 24/72; G02B 6/4268
USPC ..... 361/679.46, 679.52, 688, 702, 704, 707, 361/709, 711
See application file for complete search history.

(56) References Cited

U.S. PATENT DOCUMENTS

| | | | | |
|---|---|---|---|---|
| 7,764,504 B2* | 7/2010 | Phillips | .............. | H01R 13/6582 361/715 |
| 8,223,498 B2* | 7/2012 | Lima | .................... | H05K 1/0204 361/720 |
| 8,535,787 B1* | 9/2013 | Lima | .................... | B32B 27/281 428/195.1 |
| 2003/0161108 A1* | 8/2003 | Bright | .................. | G02B 6/4277 361/707 |
| 2005/0285046 A1* | 12/2005 | Iwanczyk | .............. | H01L 31/02 250/370.15 |
| 2006/0291172 A1* | 12/2006 | Lee | ........................... | G06F 1/20 361/719 |
| 2007/0183128 A1* | 8/2007 | Pirillis | .............. | H05K 7/20418 361/715 |

(Continued)

*Primary Examiner* — Stephen S Sul
(74) *Attorney, Agent, or Firm* — Stratford Group Ltd.

(57) ABSTRACT

A cooling apparatus for a pluggable module comprises a pluggable module cage to house the pluggable module and a heat pipe coupled with a hot interface at one end and a cold interface at another end. The cooling apparatus further comprises an attachment mechanism for attaching the hot interface and the heat pipe to the pluggable module. The attachment mechanism permits mobility required to insert and secure the pluggable module in place inside the pluggable module cage to allow a good thermal coupling between the hot interface and the pluggable module.

17 Claims, 3 Drawing Sheets

(56) References Cited

U.S. PATENT DOCUMENTS

| | | | | |
|---|---|---|---|---|
| 2008/0007914 | A1* | 1/2008 | Peng | H01L 23/467 |
| | | | | 361/700 |
| 2008/0062649 | A1* | 3/2008 | Leng | H01L 23/427 |
| | | | | 361/700 |
| 2009/0109611 | A1* | 4/2009 | Anderl | H01L 23/427 |
| | | | | 361/679.47 |
| 2011/0317964 | A1* | 12/2011 | Downs | G02B 6/4201 |
| | | | | 385/92 |
| 2013/0284406 | A1* | 10/2013 | Kawasaki | H05K 7/20336 |
| | | | | 165/104.26 |
| 2014/0160679 | A1* | 6/2014 | Kelty | H05K 7/20672 |
| | | | | 361/700 |
| 2015/0029667 | A1* | 1/2015 | Szczesny | F28D 15/0275 |
| | | | | 361/700 |
| 2015/0233647 | A1* | 8/2015 | Quisenberry | H01L 23/467 |
| | | | | 62/3.7 |

* cited by examiner

COOLING APPARATUS FOR PLUGGABLE MODULES

CROSS-REFERENCE TO RELATED APPLICATIONS

This application is a continuation of U.S. patent application Ser. No. 14/967,712, filed Dec. 14, 2015, now allowed, which claims the benefit of and priority to U.S. Provisional Patent Application No. 62/255,761, titled "Cooling Apparatus For Pluggable Modules", filed on Nov. 16, 2015 and which is hereby incorporated by reference in its entirety.

BACKGROUND OF THE INVENTION

The present disclosure relates to pluggable modules, specifically to a cooling apparatus for pluggable modules.

Pluggable modules are commonly used in different applications, for example the small form-factor pluggable (SFP), which is a compact, hot-pluggable transceiver used for both telecommunication and data communications applications. SFPs come in a variety of types. Although the descriptions of the embodiments below refer to SFP transceivers as an example, the embodiments are applicable to any pluggable modules.

As known in the art, a heat sink is may be made of metal fins. System enclosures housing SFPs often use a forced air cooling mechanism (e.g., fans) that circulate cool air through the fins to cool the SFPs inside the enclosure. The amount of watts used by the SFP is limited by the ability of this thermal management system to keep the SFP device below its maximum operating temperature limit. The use of fans, which are active parts, limits the reliability and durability of the system.

BRIEF SUMMARY OF THE INVENTION

A cooling apparatus for a pluggable module comprising a pluggable module cage to house the pluggable module, and a heat pipe coupled with a hot interface at one end and a cold interface at another end. The cooling apparatus further comprising an attachment mechanism for attaching the hot interface and the heat pipe to the pluggable module, wherein the attachment mechanism permits mobility required to insert and secure the pluggable module in place inside the pluggable module cage to allow a good thermal coupling between the hot interface and the pluggable module.

The foregoing and additional aspects and embodiments of the present disclosure will be apparent to those of ordinary skill in the art in view of the detailed description of various embodiments and/or aspects, which is made with reference to the drawings, a brief description of which is provided next.

This Summary is provided to introduce a selection of concepts in a simplified form that are further described below in the Detailed Description. It should be understood that this Summary is not intended to identify key features or essential features of the claimed subject matter, nor is it intended to be used to limit the scope of the claimed subject matter.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

The foregoing and other advantages of the disclosure will become apparent upon reading the following detailed description and upon reference to the drawings.

Figure 1:
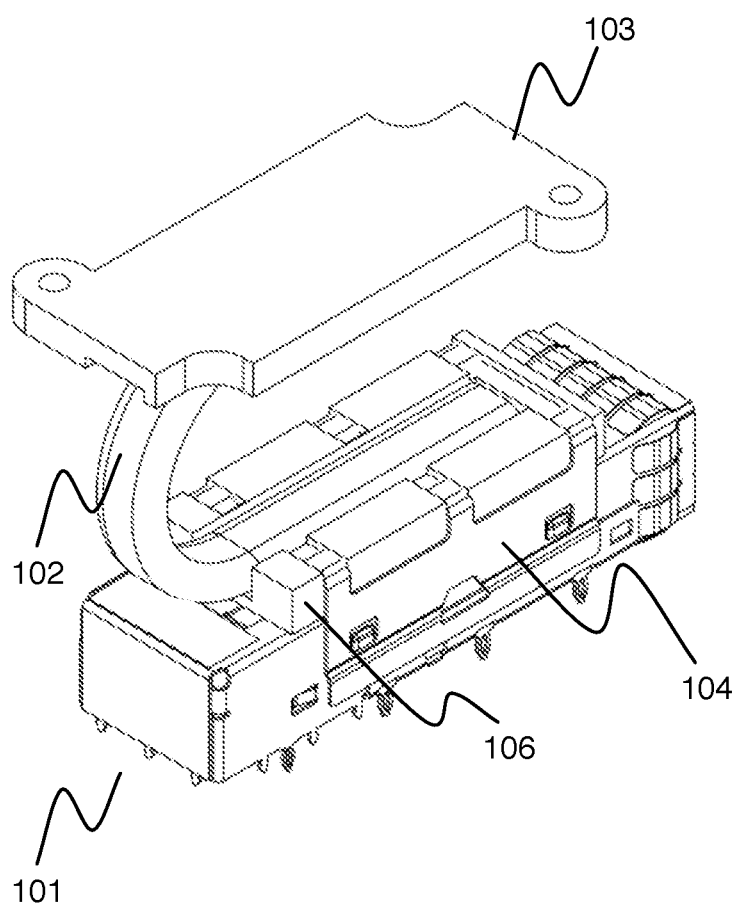
FIG. 1 is an example of a pluggable module cage with a cooling apparatus.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

An effect of the technology disclosed here in is the ability to cool SFPs without fans inside the system enclosure. Implementations of the invention utilize heat pipes to cool SFPs.

A heat pipe is a heat-transfer device that combines the principles of both thermal conductivity and phase transition to efficiently manage the transfer of heat between two solid interfaces.

At the hot interface of a heat pipe, a liquid in contact with a thermally conductive solid surface turns into a vapor by absorbing heat from that surface. The vapor then travels along the heat pipe to the cold interface and condenses back into a liquid—releasing the latent heat. The liquid then returns to the hot interface through either capillary action, centrifugal force, or gravity, and the cycle repeats. Due to the very high heat transfer coefficients for boiling and condensation, heat pipes are highly effective thermal conductors.

A system can be designed to contain in an enclosure one or more SFPs. SFPs are housed in a standard SFP cage, which is standardized by American National Standard (ANSI) INF-8074i. SFP cages may include one or more SFPs. Some SFP cages are designed to have a heat sink attached to the top using a mobile attachment clipped to the cage that allows proper insertion and tight coupling between the surface of the transceiver and the heat sink. The description below assumes a single SFP, but can be extended to a cage supporting several SFPs.

Referring to FIG. 1, in one embodiment, a heat pipe 102 is thermally coupled with a hot interface or hot plate 106. The hot interface 106 is designed to be attached onto an SFP cage 101 using standard clips 104 or any other attachment mechanism that permits movement and mobility required to insert and secure the SFP transceiver in place inside the cage and to provide a good thermal coupling between the hot interface 106 and the SFP transceiver.

The transceiver inside an SFP cage 101 is thermally coupled with heat pipe 102. Heat pipe 102 is thermally coupled with a cold interface or cold plate 103, which can be attached or coupled to a system enclosure (not shown) or any other cooling mechanism. With this embodiment, there is no need for fans to be used inside the system enclosure, thus increasing the reliability and durability of the system. The hot interface 106 is attached via the clip 104 or other similar attachment apparatus to the SFP cage 101 so that hot interface 106 is thermally coupled with the SFP transceiver. Clips 104 are flexible to allow movement and mobility of the clips 104 to secure the SFP transceiver in place inside the cage 101 and to provide a good thermal coupling between the plate 106 and the SFP transceiver. In this manner, wherein the heat pipe is able to transfer heat of the SFP transceiver from the hot plate to the cold plate without a fan.

Figure 2:
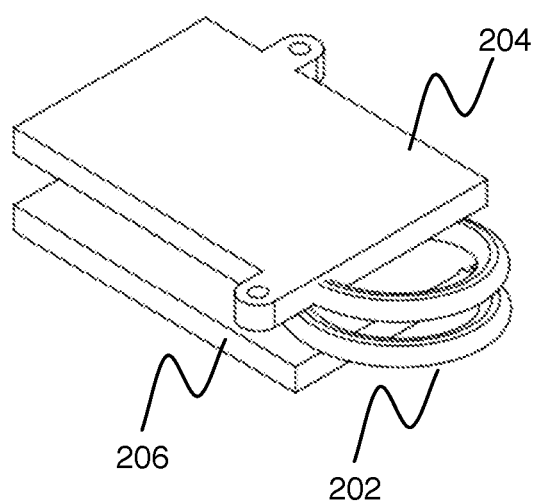
FIG. 2 is an example of a heat pipe according to one implementation.
Figure 3:
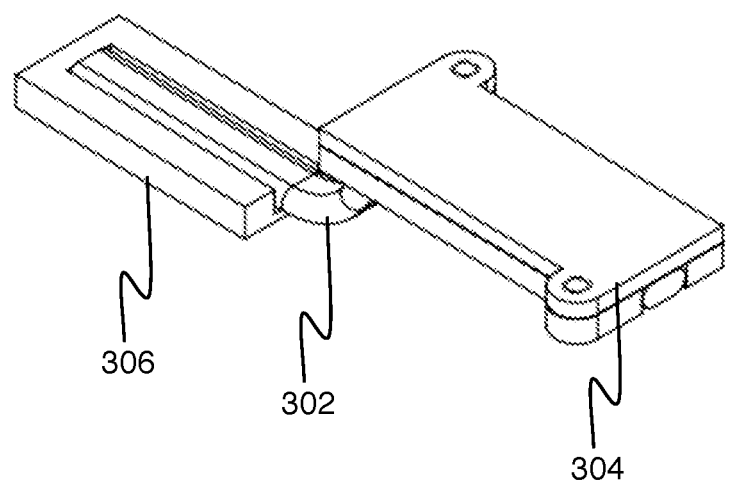
FIG. 3 is an example of a heat pipe according to one implementation.

The heat pipe 102 can be of any shape to accommodate different designs and enclosures as long as it allows for the mobility required to insert and remove the SFP transceiver. For example, as shown in FIG. 2, the heat pipe 202 can be of a spring-like or coil shape that is mobile between the cold interface or cold plate 204 and the hot interface 206 coupled with the SFP. Another example shown in FIG. 3 where the heat pipe 302 is of a bent shape allowing movement between the cold interface or cold plate 304 and the hot interface 306, which is attached to the SFP cage.

In another embodiment, the heat pipe can be affixed to the bottom side of the SFP transceiver by having an opening in the printed circuit board and in the SFP cage.

While particular implementations and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of an invention as defined in the appended claims.

What is claimed is:

1. A cooling apparatus for a pluggable module, comprising:
   a hot interface directly attached to an exterior surface of a pluggable module cage using one or more clips;
   a cold interface not in direct contact with the pluggable module;
   a heat pipe coupled to the hot interface and to the cold interface, so that the cold interface overlaps and is located substantially above the hot interface;
   the heat pipe configured to transfer heat of the pluggable module from the hot interface to the cold interface to cool said pluggable module without requiring a fan, wherein the heat from the pluggable module is transferred to a side of the hot interface facing away from the cold interface through said exterior surface of the pluggable module cage interposed between the pluggable module and the hot interface.

2. The cooling apparatus of claim 1, wherein the pluggable module is a small form-factor pluggable (SFP) module.

3. The cooling apparatus of claim 1, wherein the one or more clips comprises one or more flexible clips.

4. The cooling apparatus of claim 1, wherein the pluggable module cage is a standardized pluggable module cage.

5. The cooling apparatus of claim 1, wherein the heat pipe includes a non-linear portion configured to allow the heat pipe to flex.

6. The cooling apparatus of claim 5, wherein the heat pipe comprises a bent shape.

7. The cooling apparatus of claim 5, wherein said non-linear portion is coil-shaped.

8. The cooling apparatus of claim 1, wherein the heat pipe is curved substantially in a C-shape.

9. A fanless cooling system for a pluggable module, comprising:
   a heat pipe comprising a first portion, a second portion, and a third portion between the first and second portions;
   a hot interface clipped to an exterior surface of a pluggable module cage and thermally coupled to the first portion of the heat pipe;
   a cold interface not in direct contact with the pluggable module and thermally coupled to the second portion of the heat pipe so that the cold interface overlaps and is located substantially above the hot interface; and
   wherein the heat pipe is configured to transfer heat from the pluggable module from the hot interface to the cold interface to cool said pluggable module without requiring a fan, wherein the heat from the pluggable module is transferred to a side of the hot interface facing away from the cold interface through a surface of the pluggable module cage interposed between the pluggable module and the hot interface.

10. The fanless cooling system of claim 9, wherein the pluggable module cage is a standardized pluggable module cage.

11. The fanless cooling system of claim 9, wherein the third portion of the heat pipe is bent.

12. The fanless cooling system of claim 9, wherein the third portion of the heat pipe is non-linear.

13. The fanless cooling system of claim 9, wherein the third portion of the heat pipe is configured to flex.

14. A method comprising:
    thermally coupling a first end of a heat pipe to a cold interface;
    thermally coupling a second end of the heat pipe to a hot interface so that the cold interface overlaps and is located substantially above the hot interface; and
    thermally coupling a side of the hot interface facing away from the cold interface to an exterior surface of a pluggable module cage using one or more clips;
    wherein the heat pipe is configured to transfer heat from a pluggable module from the hot interface to the cold interface to cool said pluggable module without requiring a fan, wherein the heat from the pluggable module is transferred to the side of the hot interface facing away from the cold interface through said exterior surface of the pluggable module cage interposed between the pluggable module and the hot interface.

15. The method of claim 14, wherein the pluggable module cage is a standardized pluggable module cage.

16. The method of claim 14, wherein the pluggable module comprises a small form-factor pluggable transceiver.

17. The method of claim 14, wherein the heat pipe comprises a non-linear portion configured to allow the heat pipe to flex.

\* \* \* \* \*